United States Patent
Bruederl et al.

(10) Patent No.: US 7,329,587 B2
(45) Date of Patent: Feb. 12, 2008

(54) METHOD FOR THE PRODUCTION OF SEMI-CONDUCTOR CHIPS

(75) Inventors: Georg Bruederl, Burglengenfeld (DE); Berthold Hahn, Hemau (DE); Volker Haerle, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 96 days.

(21) Appl. No.: 10/561,255

(22) PCT Filed: Jun. 24, 2004

(86) PCT No.: PCT/DE2004/001329

§ 371 (c)(1),
(2), (4) Date: Mar. 31, 2006

(87) PCT Pub. No.: WO2005/004231

PCT Pub. Date: Jan. 13, 2005

(65) Prior Publication Data

US 2006/0211159 A1  Sep. 21, 2006

(30) Foreign Application Priority Data

Jun. 24, 2003 (DE) ................. 103 28 543

(51) Int. Cl.
*H01L 21/46* (2006.01)
(52) U.S. Cl. ................. 438/458; 438/22; 438/478; 257/79
(58) Field of Classification Search ............. 438/22, 438/25–28, 46, 47, 455, 458, 459, 478; 257/79, 257/94
See application file for complete search history.

(56) References Cited

U.S. PATENT DOCUMENTS 5,374,564 A   12/1994   Bruel (Continued)

FOREIGN PATENT DOCUMENTS

DE   19959182   6/2001

(Continued)

*Primary Examiner*—Tuan H. Nguyen
(74) *Attorney, Agent, or Firm*—Fish & Richardson P.C.

(57) ABSTRACT

A method for producing a plurality of semiconductor chips, particularly radiation-emitting semiconductor chips, each having at least one epitaxially produced functional semiconductor layer stack, comprising the following method steps:

preparing a growth substrate wafer (1) substantially comprised of semiconductor material from a semiconductor material system that is with respect to lattice parameters the same as or similar to that on which a semiconductor layer sequence for the functional semiconductor layer stack is based, forming in the growth substrate wafer (1) a separation zone (4) disposed parallel to a main face (100) of the growth substrate wafer (1), joining the growth substrate wafer (1) to an auxiliary carrier wafer (2), detaching along the separation zone (4) a portion (11) of the growth substrate wafer (1) that faces away from the auxiliary carrier wafer (2) as viewed from the separation zone (4), forming on the portion (12) of the growth substrate wafer remaining on the auxiliary carrier wafer (2) a growth surface for subsequent epitaxial growth of a semiconductor layer sequence, epitaxially growing the semiconductor layer sequence (5) on the growth surface, applying a chip substrate wafer to the semiconductor layer sequence, detaching the auxiliary carrier wafer (2), and singulating the composite composed of the semiconductor layer sequence and the chip substrate wafer (7) into mutually separate semiconductor chips.

16 Claims, 6 Drawing Sheets

U.S. PATENT DOCUMENTS

| | | |
|---|---|---|
| 5,786,606 A | 7/1998 | Nishio et al. |
| 6,103,597 A | 8/2000 | Aspar et al. |
| 6,559,075 B1 | 5/2003 | Kelly et al. |
| 2003/0113983 A1 | 6/2003 | Henley et al. |
| 2004/0014299 A1 | 1/2004 | Moriceau et al. |
| 2004/0029359 A1 | 2/2004 | Letertre et al. |
| 2004/0033638 A1 | 2/2004 | Bader et al. |
| 2006/0189098 A1* | 8/2006 | Edmond .................... 438/460 |
| 2006/0202105 A1* | 9/2006 | Krames et al. .......... 250/208.1 |

FOREIGN PATENT DOCUMENTS

| | | |
|---|---|---|
| DE | 10051465 | 5/2002 |
| EP | 1244139 | 9/2002 |
| WO | WO 98/14986 | 4/1998 |
| WO | WO 02/33760 | 4/2002 |
| WO | WO 02/37556 | 5/2002 |
| WO | WO 02/43112 | 5/2002 |

* cited by examiner

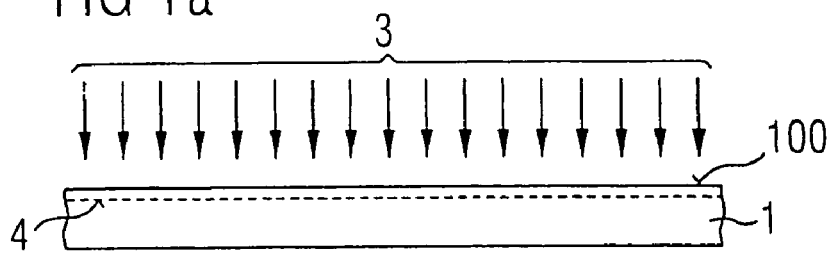
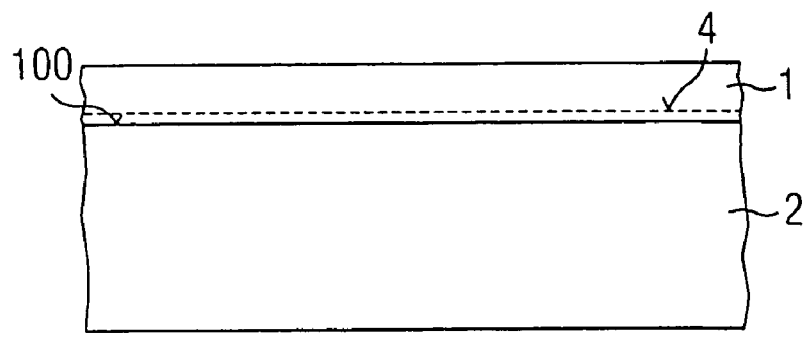
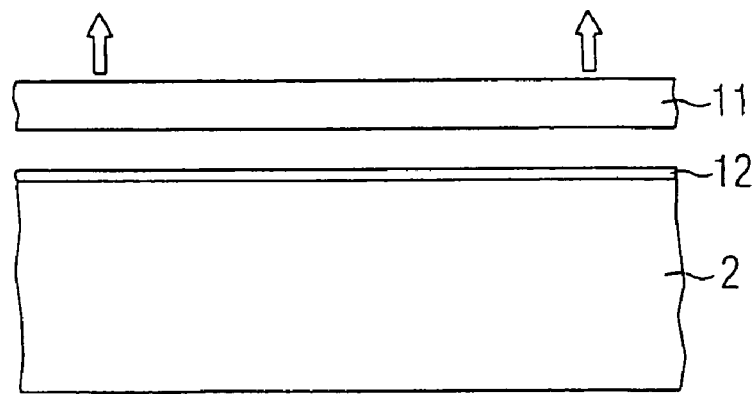

METHOD FOR THE PRODUCTION OF SEMI-CONDUCTOR CHIPS

CROSS-REFERENCE TO RELATED APPLICATIONS

This application is the National Stage of International Application No. PCT/DE2004/001329, filed Jun. 24, 2004, which claims the benefit of German Patent Application Ser. No. 103 28 543.1, filed on Jun. 24, 2003. The contents of both applications are hereby incorporated by reference in their entireties.

FIELD OF THE INVENTION

The invention concerns a method for producing a plurality of semiconductor chips, particularly radiation-emitting semiconductor chips, each having at least one epitaxially produced functional semiconductor layer stack.

BACKGROUND OF THE INVENTION

One of the chief prerequisites for increasing the internal efficiency of radiation-emitting semiconductor structures based on nitride III/V compound semiconductor material, particularly based on GaN semiconductor material, is to reduce defect density in the nitride semiconductor material. The most promising method for this purpose is to prepare growth surfaces from the same material system as the particular radiation-emitting semiconductor structure that is to be grown epitaxially. Suitable substrates are difficult to obtain in many cases; by the same token, they can be produced only with high technical expenditure and are therefore much more expensive than the alternative substrates, such as for example SiC substrates and sapphire substrates, that are commonly used for GaN-based radiation-emitting semiconductor structures.

In the present context, the group of radiation-emitting semiconductor structures based on nitride III/V compound semiconductor materials includes in particular any semiconductor structure, suitable for a radiation-emitting semiconductor component, that comprises a layer sequence composed of various individual layers and that contains at least one individual layer comprising a nitride III/V compound semiconductor material, preferably from the nitride III/V compound semiconductor material system $In_xAl_yGa_{1-x-y}N$, in which $0 \leq x \leq 1$, $0 \leq y \leq 1$ and $x+y \leq 1$. This naturally does not rule out the possibility that the composition may include other elements besides In, Al and/or Ga and N. Such a semiconductor structure can for example comprise a conventional pn junction, a double heterostructure, a single quantum well structure (SQW structure) or a multiple quantum well structure (MQW structure). Such structures are known to those skilled in the art and thus will not be elaborated on herein.

SUMMARY OF THE INVENTION

The object of the present invention is to provide a method for producing semiconductor chips which, with the smallest possible substrate expenditure, allows the desired semiconductor layer sequence to be grown on a growth surface made of a material system that is the same as or similar to that from which the pertinent semiconductor layer sequence that is to be grown epitaxially is taken.

In a method according to the invention, a growth substrate wafer is joined to an auxiliary carrier wafer. The growth substrate wafer is substantially comprised of semiconductor material from a semiconductor material system that is, particularly in terms of its lattice parameters, the same as or similar to that on which the semiconductor layer sequence for the functional semiconductor layer stack is based. The auxiliary carrier wafer is transparent to high-energy electromagnetic radiation, particularly laser radiation.

Formed in the growth substrate wafer, parallel to the joint plane between the growth substrate wafer and the auxiliary carrier wafer, is a separation zone along which a portion of the growth substrate wafer is detached after being applied to the auxiliary carrier wafer, so that only a portion of the growth substrate wafer remains on the auxiliary carrier wafer. The detached portion of the growth substrate wafer can advantageously be used to produce further auxiliary carrier wafer/growth substrate wafer composites.

After the partial detachment of the growth substrate wafer, the parting plane of the portion of the growth substrate wafer remaining on the auxiliary carrier wafer is configured as a growth surface for the subsequent epitaxial growth of a semiconductor layer sequence of the semiconductor layer stack.

The semiconductor layer sequence for the semiconductor layer stack is then in turn grown epitaxially on this growth surface.

After these method steps, a chip substrate wafer is applied to the semiconductor layer sequence and the auxiliary carrier wafer is detached.

The application of the chip substrate wafer to the semiconductor layer sequence, may, if provided for, be preceded by the application of a metallic contact layer and/or by the application of a reflective layer or layer sequence as required for the production of thin-layer light-emitting diode (LED) chips.

Finally, electrical contact layers, for example in the form of contact metallizations, can be applied to the side of the semiconductor layer sequence facing away from the chip substrate wafer, after which the composite composed of the semiconductor layer sequence and the chip substrate wafer is singulated into mutually separate semiconductor chips.

In an advantageous embodiment, prior to the application of the chip substrate wafer the semiconductor layer sequence is structured into a plurality of epitaxial semiconductor layer stacks disposed side by side on the auxiliary carrier wafer. Thereafter, at least sidewalls of the epitaxial semiconductor layer stack can be provided at least partially with passivating material. In addition, the epitaxial semiconductor layer sequence can, if necessary, be provided with an electrical contact layer prior to the application of the chip substrate wafer.

The separation zone is preferably produced by ion implantation, for example of hydrogen.

The separation of the composite composed of the subsidiary carrier substrate and the growth substrate along the separation zone is preferably effected by thermal cleavage. A method of this kind is known for example from U.S. Pat. No. 5,374,564 and U.S. Pat. No. 6,103,597, whose disclosure content in this regard is hereby incorporated for reference.

The application of the semiconductor layer sequence, its further processing, if any, and the application of the chip substrate wafer are followed by detachment of the auxiliary carrier wafer. This is preferably done by means of a laser liftoff process. The auxiliary carrier wafer is detached substantially completely from the semiconductor layer sequence or semiconductor layer stacks.

"Substantially completely" is to be understood as meaning that the auxiliary carrier wafer is detached to such an extent that such residues of the auxiliary carrier wafer as remain on the semiconductor layer sequence or semiconductor layer stacks can have no or only a negligibly small adverse effect on the semiconductor layer sequence or semiconductor layer stacks. The auxiliary carrier wafer is preferably detached completely.

The auxiliary carrier wafer is, for example, transparent to electromagnetic radiation with wavelengths below 360 nm.

The auxiliary carrier wafer is preferably matched in terms of thermal expansion coefficient to the growth substrate wafer.

In a method according to the invention, the auxiliary carrier wafer advantageously must not be monocrystalline and is preferably polycrystalline.

The joint between the growth substrate wafer and the auxiliary carrier wafer can advantageously be produced by means of silicon oxide.

In the case of a semiconductor layer sequence based on GaN, the material of the growth substrate wafer is preferably also based on GaN. In this case the auxiliary carrier wafer can preferably be made of sapphire and/or AlN.

The growth surface for the semiconductor layer sequence is advantageously prepared for epitaxial growth by etching and/or grinding.

A method according to the invention is particularly well suited for the production of defect-reducing semiconductor structures, particularly defect-reducing semiconductor structures based on nitride III/V compound semiconductor materials.

In the present context, the group of radiation-emitting semiconductor structures based on nitride III/V compound semiconductor materials includes in particular any semiconductor structure, suitable for a radiation-emitting semiconductor component, that comprises a layer sequence composed of different individual layers and that contains at least one individual layer comprising a nitride III/V compound semiconductor material, preferably from the nitride III/V compound semiconductor material system $In_xAl_yGa_{1-x-y}N$, in which $0 \leq x \leq 1$, $0 \leq y \leq 1$ and $x+y \leq 1$. A GaN-based semiconductor structure comprises for example at least one semiconductor layer that contains $In_xAl_yGa_{1-x-y}N$ in which $0 \leq x \leq 1$, $0 \leq y \leq 1$ and $x+y \leq 1$.

This naturally does not rule out the possibility that the composition may include other elements besides In, Al and/or Ga and N. Such a semiconductor structure can for example comprise a conventional pn junction, a double heterostructure, a single quantum well structure (SQW structure) or a multiple quantum well structure (MQW structure). Such structures are known to those skilled in the art and thus will not be elaborated on herein.

The portion of the growth substrate wafer that is detached during the method is preferably used to produce further semiconductor chips and is joined for this purpose to another auxiliary carrier wafer, from which a portion is again detached according to the procedure described above. This can advantageously be repeated multiple times until the growth substrate wafer is used up.

The semiconductor layer sequence can be produced for example by metalorganic vapor-phase epitaxy (MOVPE), molecular beam epitaxy (MBE) and/or liquid-phase epitaxy (LPE) or by any other conventional method.

The above-described combination of the thermal detachment of portions of a growth substrate wafer, for example of GaN, by means of an implanted separation zone with the laser liftoff of an auxiliary carrier wafer for a portion of the growth substrate wafer remaining upon thermal detachment makes it possible in particular to produce high-power LEDs inexpensively on high-grade GaN quasi-substrates. In addition, the GaN-based thin-film technology used to manufacture LEDs can be optimized by the use of defect-reducing and lattice-matched GaN quasi-substrates.

BRIEF DESCRIPTION OF THE DRAWINGS

Further advantages, embodiments and improvements of the method will become apparent from the exemplary embodiments described hereinbelow in connection with FIGS. 1a to 2h. Therein:

FIGS. 1a to 1i are a schematic representation of the method according to a first exemplary embodiment.

Figure 1D:
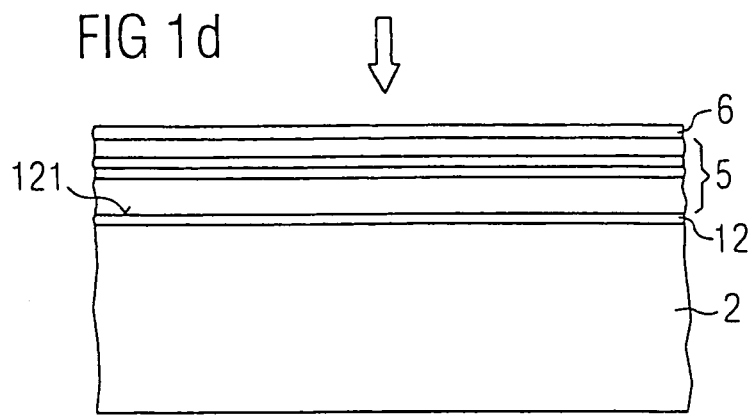

In the figures, like or like-acting elements are provided with the same respective reference numerals. The schematic representations are not to be considered true to scale.

DETAILED DESCRIPTION OF THE PREFERRED EMBODIMENTS

In the method according to the first exemplary embodiment, a plurality of LED chips based on nitride III/V compound semiconductor material is produced.

A growth substrate wafer 1 made of nitride-based material, for example GaN, is first prepared. In this growth substrate wafer 1 is formed a separation zone 4 disposed substantially parallel to a main face 100 of the growth substrate wafer (see FIG. 1a). This is preferably done by ion implantation (for example of hydrogen) through the main face 100 of the growth substrate wafer 1 (indicated by the arrows 3). This separation zone 4 is located in the ion-implanted region of the growth substrate wafer 1. Such a method is known in principle for example from U.S. Pat. No. 5,374,564 and U.S. Pat. No. 6,103,597.

The growth substrate wafer 1 is then joined to an auxiliary carrier wafer 2, specifically with main face 100 preferably oriented toward auxiliary carrier wafer 2 (see FIG. 1b).

Auxiliary carrier wafer 2 is transparent to high-energy electromagnetic radiation, particularly to laser radiation, which will be used for a subsequent laser liftoff process (as explained subsequently hereinbelow). Auxiliary carrier wafer 2 is transparent to a wavelength range below 360 nm. Auxiliary carrier wafer 2 is preferably matched in terms of thermal expansion coefficient to growth substrate wafer 1.

Auxiliary carrier wafer 2 is made for example substantially of sapphire and/or AlN. Auxiliary carrier wafer 2 can advantageously be polycrystalline. The joint between growth substrate wafer 1 and auxiliary carrier wafer 2 can be produced for example by means of silicon oxide.

A portion 11 of growth substrate wafer 1 that faces away from auxiliary carrier wafer 2, as viewed from separation zone 4, is then detached, preferably thermally cleaved (see FIG. 1c), along separation zone 4. Once again, a process of this kind is known in principle for example from U.S. Pat. No. 5,374,564 and U.S. Pat. No. 6,103,597.

The parting plane formed by the portion 12 of growth substrate wafer 1 remaining on auxiliary carrier wafer 2 and exposed by the separation process described in the previous paragraph is then prepared, for example by etching and/or grinding, such that it is suitable for use as a growth surface 121 for the epitaxial growth of a semiconductor layer sequence 5 for the intended semiconductor structures.

The semiconductor layer sequence 5 is then grown on the growth surface 121, for example by metalorganic vapor phase epitaxy (MOVPE) (see FIG. 1d).

A, for example, metallic electrical contact layer 6 is applied to the face of semiconductor layer sequence 5 directed away from auxiliary carrier substrate 2. This contact layer 6 can be composed for example of a conventional contact layer material suitable for the semiconductor material system concerned. Such contact layer materials are known to the person skilled in the art and thus will not be elaborated on herein. In addition, a reflective layer (not shown) can be applied between semiconductor layer sequence 5 and contact layer 6 or to contact layer 6, as is necessary for example for the production of so-called thin-layer LED chips.

Figure 1E:
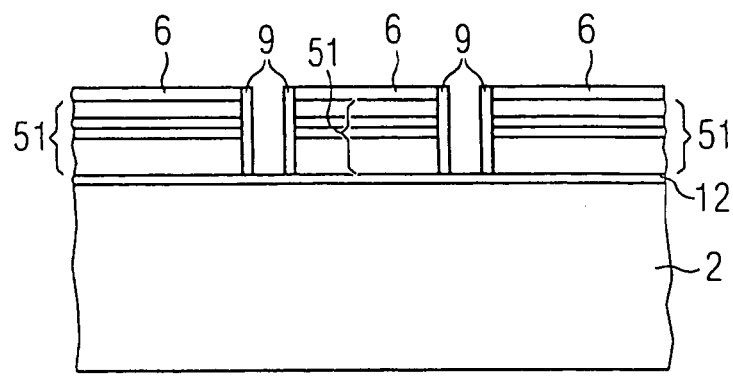

After that the semiconductor layer sequence 5 is structured, for example by masking and etching, into a plurality of semiconductor layer stacks 51 (mesas) (see FIG. 1e).

A passivating layer 9 is then applied to the sidewalls of the semiconductor layer stacks 51. This, too, can be composed of a conventional passivating material suitable for the semiconductor material system concerned. Such passivating materials, again, are familiar to the person skilled in the art and thus will not be elaborated on herein.

Figure 1F:
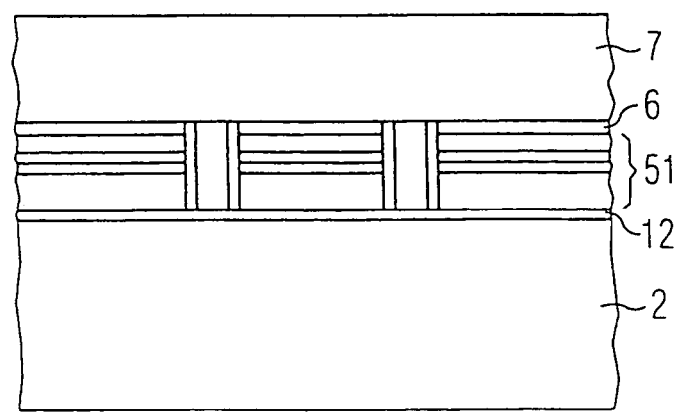

After these process steps, each semiconductor layer stack 51 is joined, for example by bonding, on its face directed away from auxiliary carrier substrate 2, to a chip substrate wafer 7 of comparable mechanical stability (FIG. 1f). This is made for example of Ge, but can also be composed of another suitable electrically conductive chip carrier material. One example of such a material is GaAs. Metals such as Mo or Au are also suitable in principle.

Figure 1G:
Figure 1G:
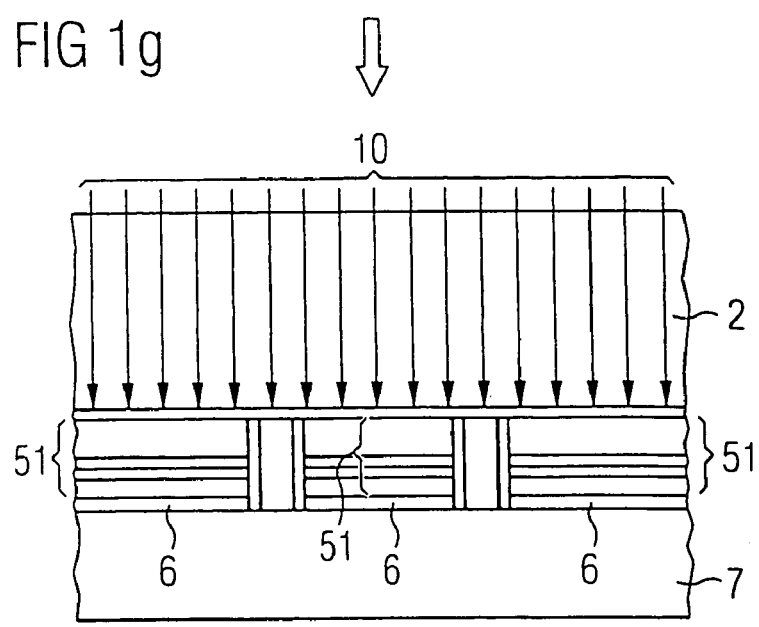

This is followed by liftoff of the auxiliary carrier wafer 2 from the semiconductor layer stacks 51 through auxiliary carrier wafer 2 by means of laser radiation (indicated in FIG. 1g by the arrows 10). For this purpose, either the joint layer between the auxiliary carrier wafer and the remaining portion of the growth substrate wafer, for example a silicon oxide bonding layer, or a semiconductor layer located at the interface with or in the vicinity of the joint layer can be selectively thermally decomposed. Optionally, before auxiliary carrier wafer 2 is joined to growth substrate wafer 1, a sacrificial layer can be applied to auxiliary carrier wafer 2 and then decomposed using laser radiation during this liftoff step.

In this process, thermal stresses in the structure during irradiation with laser radiation facilitate the spread of cracks in the bonding plane.

Suitable laser liftoff methods are known for example from WO 98/14986, whose disclosure content to this extent is hereby incorporated by reference.

Figure 1H:
Figure 1H:
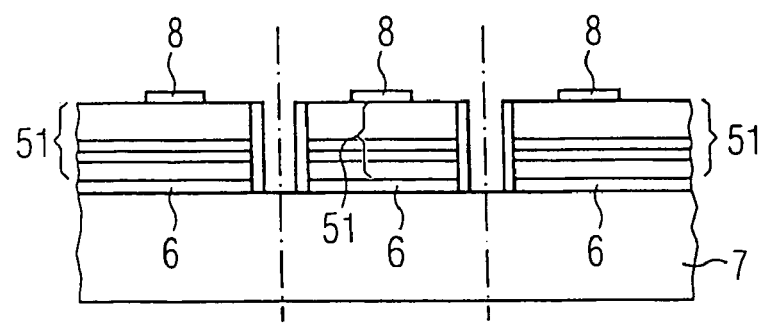

After the liftoff of auxiliary carrier wafer 2, the exposed face of the semiconductor layer stack 51 is finish-processed. This can include for example the application of electrical contact structures 8, the production of surface roughening and/or the application of a passivating layer (see FIG. 1h).

Figure 1I:
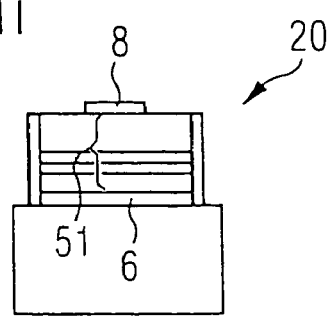

Finally, the composite composed of semiconductor layer stacks 51 and chip carrier wafer 7 is singulated into individual LED chips 20, for example by sawing and/or breaking the chip carrier substrate wafer 7 between the semiconductor layer stacks 51 (see FIG. 1i).

In the second exemplary embodiment, the method steps match the corresponding method steps of the first exemplary embodiment (see FIGS. 1a to 1d) through to the application of the epitaxial semiconductor layer sequence 5 (see FIGS. 2a to 2d).

Figure 2A:
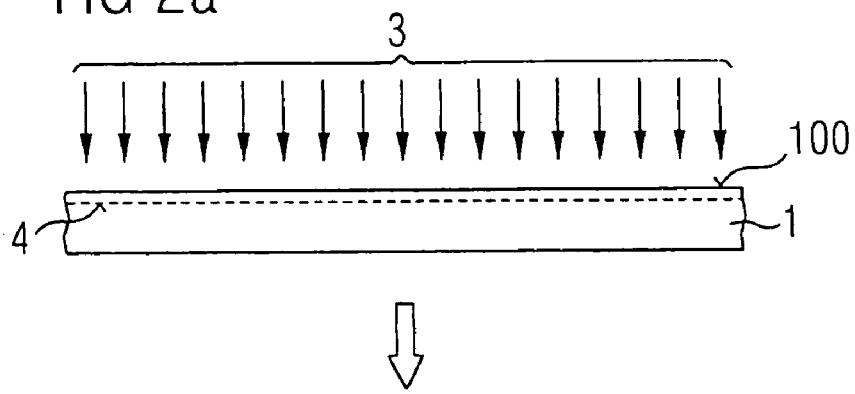
FIGS. 2a to 2h are a schematic representation of the method according to a secondary embodiment.
Figure 2B:
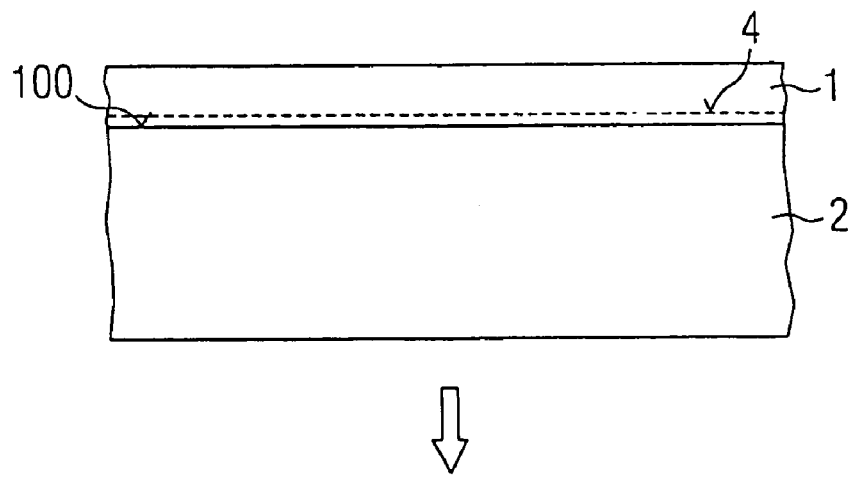
Figure 2C:
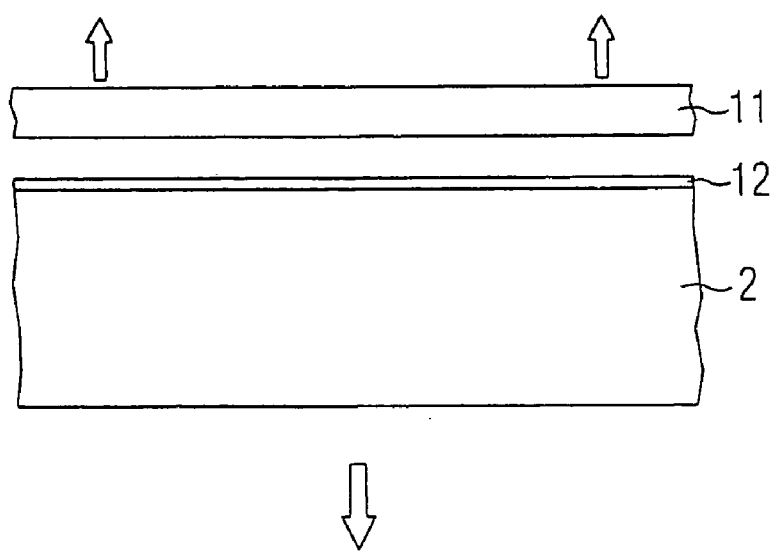
Figure 2D:
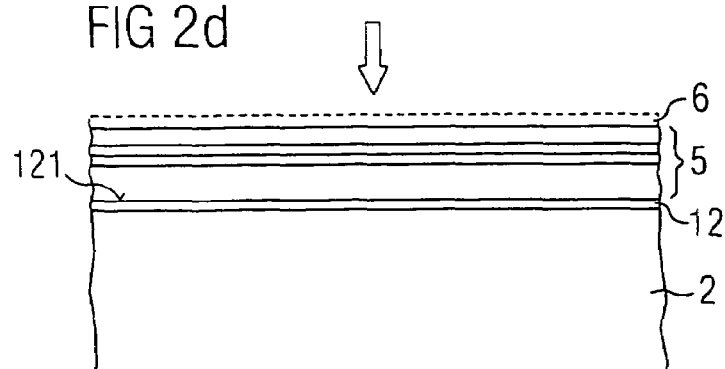
Figure 2E:
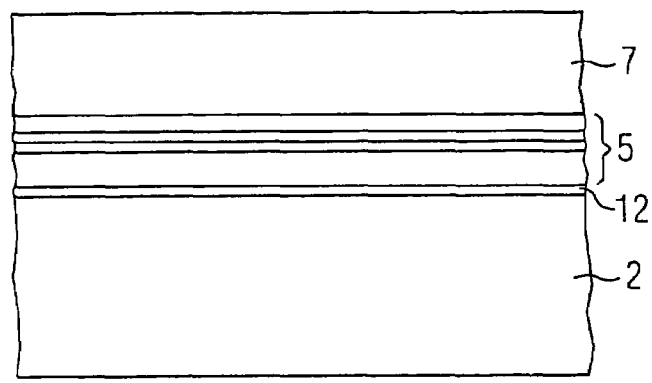
Figure 2F:
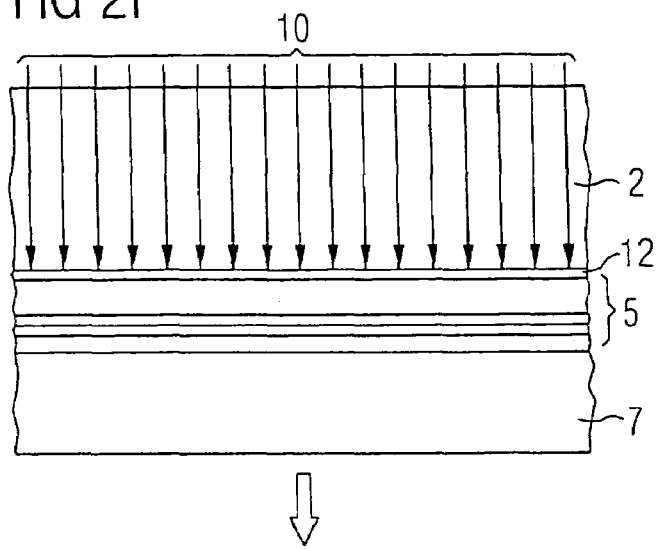

In contrast to the first exemplary embodiment, semiconductor layer sequence 5, optionally including contact layer 6 if necessary, and therein, is not structured into semiconductor layer stacks 51 prior to the application of chip carrier substrate wafer 7, but rather not until after chip carrier substrate wafer 7 has been applied (see FIG. 2e) and auxiliary carrier wafer 2 detached (see FIG. 2f). Contact layer 6 is indicated only in broken lines in FIG. 2d and has been omitted from FIGS. 2e to 2h, since it is not needed in this specific example.

The application of chip carrier substrate wafer 7 and the detachment of auxiliary carrier wafer 2 are effected analogously to the corresponding method steps of the first exemplary embodiment described above.

Figure 2G:
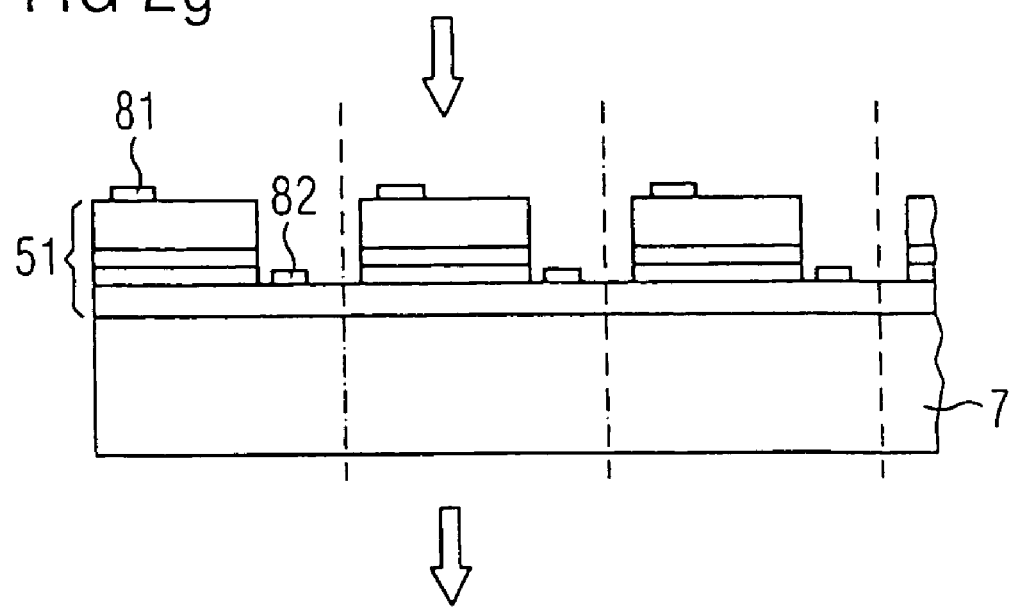

After the detachment of auxiliary carrier substrate 2, the epitaxial semiconductor layer sequence 5 is structured into individual semiconductor layer stacks 51, and electrical contact layers 81, 82 are applied to the semiconductor layer stacks 51 (see FIG. 2g). This can be performed by a conventional masking and etching technique or a metallization technique.

Figure 2H:
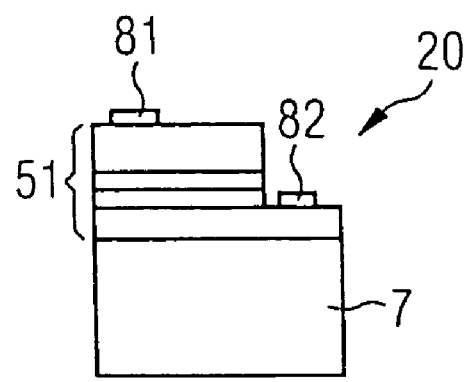

Finally, the composite composed of semiconductor layer stacks 51 and chip carrier wafer 7 is singulated into individual LED chips 20, for example by sawing and/or breaking the chip carrier substrate wafer 7 between the semiconductor layer stacks 51 (see FIG. 2h).

The invention naturally is not limited to the exemplary embodiments by the description of it with reference thereto. Rather, the invention encompasses any novel feature and any combination of features, including in particular any combination of individual features recited in the various claims or exemplary embodiments, even if that feature or combination itself is not explicitly mentioned in the claims or exemplary embodiments.

The invention claimed is:

1. A method for producing a plurality of semiconductor chips, particularly radiation-emitting semiconductor chips, each having at least one epitaxially produced functional semiconductor layer stack, comprising the following method steps: preparing a growth substrate wafer substantially comprised of semiconductor material from a semiconductor material system that is in terms of lattice parameters the same as or similar to that on which a semiconductor layer sequence for the functional semiconductor layer stack is based, forming in said growth substrate wafer a separation zone disposed parallel to a main face of said growth substrate wafer, joining said growth substrate wafer to an auxiliary carrier wafer, detaching along said separation zone a portion of said growth substrate wafer that faces away from said auxiliary carrier wafer as viewed from said separation zone, forming on the portion of said growth substrate wafer remaining on said auxiliary carrier wafer a growth surface for subsequent epitaxial growth of a semiconductor layer sequence, epitaxially growing said semiconductor layer sequence on said growth surface, applying a chip substrate wafer to said semiconductor layer sequence, detaching said auxiliary carrier wafer, and singulating the composite composed of said semiconductor layer sequence and said chip substrate wafer into mutually separate semiconductor chips.

2. The method according to claim 1, wherein prior to the application of said chip substrate wafer, said semiconductor layer sequence is structured into a plurality of epitaxial semiconductor layer stacks disposed side by side on said auxiliary carrier wafer.

3. The method according to claim 2, wherein at least sidewalls of said epitaxial semiconductor layer stack are provided at least partially with passivating material.

4. The method according to claim 1, wherein prior to the application of said chip substrate wafer, said epitaxial semiconductor layer sequence is provided with an electrical contact layer.

5. The method according to claim 1, wherein said separation zone is produced by ion implantation.

6. The method according to claim 5, wherein hydrogen is implanted.

7. The method according to claim 1, wherein the portion of said growth substrate wafer facing away from said auxiliary carrier wafer as viewed from said separation zone is thermally cleaved along said separation zone.

8. The method according to claim 1, wherein said auxiliary carrier wafer is transparent to electromagnetic radiation with wavelengths below 360 nm.

9. The method according to claim 1, wherein said auxiliary carrier wafer is transparent to high-energy electromagnetic radiation, particularly laser radiation.

10. The method according to claim 9, wherein said auxiliary carrier wafer is detached from said semiconductor layer sequence or from said semiconductor layer stack by a laser liftoff process.

11. The method according to claim 1, wherein said auxiliary carrier wafer is matched in terms of thermal expansion coefficient to said growth substrate wafer.

12. The method according to claim 1, wherein said auxiliary carrier wafer is polycrystalline.

13. The method according to claim 1, wherein the joint between said growth substrate wafer and said auxiliary carrier wafer is produced by means of silicon oxide.

14. The method according to at claim 1, wherein said semiconductor layer sequence includes at least one semiconductor layer based on GaN and the material of said growth substrate wafer is also based on GaN.

15. The method according to claim 14, wherein said auxiliary carrier wafer is composed of sapphire and/or AlN.

16. The method according to claim 1, wherein said growth surface is prepared for the epitaxial growth of said semiconductor layer sequence by etching and/or grinding.

* * * * *